(12) United States Patent
Vanderwees

(10) Patent No.: US 11,582,884 B2
(45) Date of Patent: Feb. 14, 2023

(54) ULTRA THIN TWO PHASE HEAT EXCHANGERS WITH STRUCTURAL WICK

(71) Applicant: Dana Canada Corporation, Oakville (CA)

(72) Inventor: Doug Vanderwees, Mississauga (CA)

(73) Assignee: Dana Canada Corporation, Oakville (CA)

(*) Notice: Subject to any disclaimer, the term of this patent is extended or adjusted under 35 U.S.C. 154(b) by 222 days.

(21) Appl. No.: 16/732,719

(22) Filed: Jan. 2, 2020

(65) Prior Publication Data

US 2020/0221605 A1 Jul. 9, 2020

Related U.S. Application Data

(60) Provisional application No. 62/789,778, filed on Jan. 8, 2019.

(51) Int. Cl.
| | | |
|---|---|---|
| *H05K 7/20* | (2006.01) | |
| *B22F 7/00* | (2006.01) | |
| *B22F 3/11* | (2006.01) | |
| *F28D 15/04* | (2006.01) | |
| *B22F 3/00* | (2021.01) | |
| *F28D 15/02* | (2006.01) | |

(52) U.S. Cl.
CPC ......... *H05K 7/20309* (2013.01); *B22F 3/004* (2013.01); *B22F 3/11* (2013.01); *B22F 7/004* (2013.01); *F28D 15/046* (2013.01); *F28D 15/0233* (2013.01)

(58) Field of Classification Search
USPC .................................................. 29/890.032
See application file for complete search history.

(56) References Cited

U.S. PATENT DOCUMENTS

| | | | |
|---|---|---|---|
| 7,137,442 B2 | 11/2006 | Kawahara et al. | |
| 8,246,902 B2* | 8/2012 | Hou | B22F 3/225 |
| | | | 419/36 |
| 9,459,050 B2 | 10/2016 | Zhao et al. | |
| 2004/0211549 A1* | 10/2004 | Garner | F28D 15/046 |
| | | | 431/325 |
| 2018/0259268 A1* | 9/2018 | Zhou | F28D 15/046 |
| 2019/0082560 A1* | 3/2019 | Dede | G06F 1/20 |

OTHER PUBLICATIONS

Ju, Y. Sungtaek, et al. "Planar vapor chamber with hybrid evaporator wicks for the thermal management of high-heat-flux and high-power optoelectronic devices." International Journal of Heat and Mass Transfer 60 (2013): 163-169. (Year: 2013).*
Vanderwees, D. et al., "Ultra Thin Heat Exchangers for Thermal Management," U.S. Appl. No. 16/047,484, filed Jul. 27, 2018, 42 pages.

* cited by examiner

*Primary Examiner* — Anthony J Zimmer
*Assistant Examiner* — Sean P. O'Keefe
(74) *Attorney, Agent, or Firm* — McCoy Russell LLP

(57) ABSTRACT

Methods and system are provided for a heat exchanger. In one example, a system, comprises a mobile electronic device comprising a front cover and a rear cover, a heat exchanger arranged between the front cover and the rear cover, the heat exchanger comprising a fluid chamber arranged between an inner surface of a first plate and an inner surface of a second plate, and a wick material arranged within the fluid chamber, the wick material comprising a sintered material configured to allow a plurality of fluid passages to extend therethrough.

9 Claims, 13 Drawing Sheets

ULTRA THIN TWO PHASE HEAT EXCHANGERS WITH STRUCTURAL WICK

CROSS REFERENCE TO RELATED APPLICATION

The present application claims priority to U.S. Provisional Application No. 62/789,778, entitled "Ultra Thin Two Phase Heat Exchangers with Structural Wick", and filed on Jan. 8, 2019. The entire contents of the above-listed application are hereby incorporated by reference for all purposes.

TECHNICAL FIELD

The present disclosure generally relates to thermal management of heat-generating electronic components, such as computer chips in personal electronic devices such as smart phones, tablets, and computers, and specifically to ultra-thin heat transfer devices for personal electronic devices, and methods for their manufacture.

BACKGROUND AND SUMMARY

The heat generated by computer chips and/or other heat-generating components in personal electronic devices may be dissipated to maintain high processing speeds and to avoid high temperatures which may cause degradation to the device or discomfort to the user. For example, 43° C. is specified as the maximum skin contact temperature for a handheld device and, for computer chips, temperatures above about 75-85° C. may significantly impact lifetime and performance. Heat dissipation is of greater concern as chip sizes continue to decrease and processing speeds increase, resulting in increased power densities and greater heat generation per unit area.

Some personal electronic devices incorporate thin heat-spreading devices such as planar sheets of graphite and/or copper, and/or heat pipes mounted on planar sheets, to spread and dissipate the heat generated by the computer chip over the area of the device. It is believed that the effectiveness of these existing technologies may not be sufficient to deal with the increased power densities of future generations of computer chips.

Compact cooling devices are known in which the heat of the computer chip is transported away from the chip as latent heat of evaporation. These devices are known as "vapor chambers", and have a flat, planar, panel-like structure with an internal chamber containing a working fluid. The vapor chamber spreads heat energy received at a local area as uniformly as possible throughout its entire area, thereby acting like an extended fin surface for conducting or convecting the energy away from the computer chip.

The local area of the vapor chamber which is in contact with the computer chip and/or other heat-generating component contains working fluid in the liquid state. Heat from the computer chip is transferred to the working fluid, which is vaporized and circulated through internal gas flow passages to cooler areas of the vapor chamber, where its temperature drops and it uses the larger fin area to condense, releasing the heat of condensation in areas away from the chip. The condensed working fluid is then wicked back to the area of the chip by capillary flow to repeat the cycle.

An example of a vapor chamber is disclosed in commonly assigned U.S. patent application Ser. No. 16/047,484 by Vanderwees et al., the contents of which are incorporated herein by reference in their entirety. According to the structure proposed by Vanderwees et al., a vapor chamber comprises a wicking element enclosed between a pair of sheets, wherein the wicking element comprises one or more layers of wire mesh. Each wicking element is cut from a larger sheet of material and includes a first plurality of cut-outs defining gas flow passages, and may also include a second plurality of cutouts defining spaces in which reinforcing ribs are provided, wherein the reinforcing ribs traverse the height of the fluid chamber to provide structural support for the sheets of the vapor chamber. The trimming of the wicking element and the formation of cutouts therein generate significant amounts of in-process scrap, as much as 50-80 percent of the wire mesh material, and the reinforcing ribs can also occupy significant amounts of space.

There remains a need for improved heat exchangers which are sufficiently rigid, thin, durable, and inexpensive to manufacture, as well as manufacturing methods to achieve these objectives.

SUMMARY

In one aspect, there is provided a heat exchanger for thermal management of a heat-generating component. The heat exchanger has a first surface adapted for thermal contact with the heat-generating component, an opposed second surface, and an interior defining a fluid chamber containing a working fluid. The heat exchanger comprises a first plate, a second plate, and a wick material.

The first plate of the heat exchanger has an inner face which faces toward the interior of the fluid chamber, an outer face which defines either the first or second surface of the heat exchanger, and an outer peripheral sealing surface on the inner face of the first plate.

The second plate of the heat exchanger has an inner face which faces toward the interior of the fluid chamber, an outer face which defines either the upper or lower surface of the heat exchanger, and an outer peripheral sealing surface on the inner face of the second plate, wherein the outer peripheral sealing surfaces of the first and second plates are sealingly joined together.

The wick material of the heat exchanger is received inside the fluid chamber between the inner face of the first plate and the inner face of the second plate, a sheet of wick material having first and second opposed outer surfaces. The first outer surface of the wick material is in contact with the inner face of the first plate and the second outer surface of the wick material is in contact with the inner face of the second plate.

According to an aspect, the wick material comprises sintered particles, which may comprise copper or nickel.

According to an aspect, the first outer surface of the wick material is metallurgically bonded to the inner face of the first plate and/or the second outer surface of the wick material is metallurgically bonded to the inner face of the second plate.

According to an aspect, the heat exchanger further comprises a plurality of liquid flow passages for circulation of the working fluid in a liquid state. Each of the liquid flow passages is defined by a hydrophilic area of the wick material in which the sintered metal particles are provided; and each of the liquid flow passages comprises a plurality of pores defined by spaces between the sintered metal particles.

According to an aspect, the wick material has a porosity of about 25-75 percent in the plurality of liquid flow passages.

According to an aspect, the heat exchanger further comprises a plurality of primary gas flow passages for circulation of the working fluid in a gaseous state. The primary gas flow passages may be spaced apart from one another by the plurality of liquid flow passages.

According to an aspect, each of the primary gas flow passages is at least partly defined by a void area in the wick material, or at least partly defined by a reduced-height area in the wick material.

According to an aspect, the heat exchanger further comprises at least one secondary gas flow passage for circulation of the working fluid in a gaseous state. Each of the secondary gas flow passages interconnects two or more of the primary gas flow passages.

According to an aspect, each of the plurality of primary gas flow passages and/or each of the at least one secondary gas flow passages is at least partly defined by a void area in the wick material, or at least partly defined by a reduced-height area in the wick material.

According to an aspect, each of the plurality of primary gas flow passages is defined by a void area in the wick material. Each of the at least one secondary gas flow passages may be defined by a reduced-height area in the wick material.

According to an aspect, each reduced-height area comprises an area in which the wick material is reduced in thickness relative to the liquid flow passages, so as to permit gas flow above and/or below the reduced-height area.

According to an aspect, each reduced-height area may comprise the sintered metal particles or a non-porous strip of a metal.

According to an aspect, the heat exchanger comprises a vapor chamber and the heat-generating component is a heat-generating component of a personal electronic device selected from the group consisting of a smart phone, a tablet, and a computer.

According to an aspect, an evaporation zone is defined in the interior of the fluid chamber, between the first and second plates, wherein the evaporation zone directly opposes an area of the upper surface which is in contact with the heat-generating component. The heat exchanger may further comprise a plurality of spaced-apart primary gas flow passages for circulation of the working fluid in a gaseous state, each of the primary gas flow passages having a first end and a second end, the first ends of the plurality of primary gas flow passages being in open flow communication with one another in the evaporation zone, and the second end of each primary gas flow passage being distal from the first end. The heat exchanger may also comprise a plurality of spaced-apart liquid flow passages for circulation of the working fluid in a liquid state; and at least one secondary gas flow passage, each of which provides flow communication between the second end of one of the primary gas flow passages and at least one other of the primary gas flow passages. The second end of each primary gas flow passage may be in flow communication with at least one other of the primary gas flow passages through the at least one secondary gas flow passage. Also, some or all the primary gas flow passages in the plurality of primary gas flow passages may be interconnected with one another through the at least one secondary gas flow passages, optionally through one or more of the primary gas flow passages.

According to an aspect, the evaporation zone is located at or proximate to a first end of the heat exchanger, and the second ends of at least some of the primary gas flow passages are located proximate to a second end of the heat exchanger, longitudinally spaced from the evaporation zone. The transverse gas distribution zone may extend transversely across the heat exchanger proximate to the second end thereof, the transverse gas distribution zone being in open flow communication with the second ends of all the primary gas flow passages having their second ends located proximate to the second end of the heat exchanger.

According to an aspect, the wick material further comprises a conductive patch having a first surface which is metallurgically bonded to the inner face of the first plate, wherein the conductive patch occupies at least a portion of the evaporation zone.

According to an aspect, the conductive patch may have a solid non-porous structure or a sintered structure.

In another aspect, there is provided a method for manufacturing a heat exchanger as described herein, having a plurality of liquid flow passages for circulation of a working fluid in a liquid state and a plurality of primary gas flow passages for circulation of the working fluid in a gaseous state. The method comprises providing a mold having a plurality of depressions and a plurality of raised areas, wherein the plurality of depressions defines the plurality of liquid flow passages, and the plurality of raised areas defines the outer periphery of the wick material and the plurality of primary gas flow passages.

The method further comprises providing a plurality of metal particles. The method may further comprise filling the plurality of depressions with the plurality of metal particles. The plurality of metal particles in the depressions may be sintered by application of heat and/or pressure to form the sheet of wick material, wherein the sheet of wick material is placed between the first plate and the second plate, wherein the first and second plates are positioned with their inner faces facing toward one another, and with the peripheral sealing surface of the first plate in direct contact with the peripheral sealing surface of the second plate. The method further comprises sealingly joining the peripheral sealing surface of the first plate to the peripheral sealing surface of the second plate.

According to an aspect, the wick material includes at least one reduced-height area, each of which is formed by providing the first mold portion with a corresponding reduced-height portion having an upper surface which is spaced above the depressions and below the raised areas of the mold.

According to an aspect, the at least one reduced-height area is formed from the same particles from which a remainder of the wick material is formed, such that the at least one reduced-height area has the same composition and porosity as the wick material comprising the liquid flow passages.

According to an aspect, the at least one reduced-height area is formed from particles having a different composition and/or diameter from the particles comprising a remainder of the wick material, such that the at least one reduced-height area has a different composition and/or porosity as the wick material comprising the liquid flow passages.

According to an aspect, the at least one reduced-height area is formed from a non-porous strip of metal material which is placed into the mold cavity on top of a reduced-height area.

According to an aspect, the method further comprises a compression step either during or after the molding operation, to compress at least a portion of the wick material and thereby adjust its thickness and/or its porosity.

According to an aspect, the wick material is provided with a thicker section having a thickness of up to three times greater than that of a remainder of the wick portion, wherein the thicker section is compressed by the compression step to a thickness which is the same as that of the remainder of the wick portion, such that the compressed thicker section has a lower porosity than the remainder of the wick material.

According to an aspect, the wick material includes at least one reduced-height area, each of which is formed by the compression step.

According to an aspect, the method further comprises metallurgically bonding the wick material to the inner face of the first plate and/or the inner face of the second plate.

According to an aspect, the method further comprises metallurgically bonding a conductive metal patch to the inner face of the first plate before the step of placing the sheet of wick material between the first plate and the second plate, wherein the conductive patch is at least partly located in the evaporation zone.

According to an aspect, the method further comprises the step of filling the fluid chamber with the working fluid, wherein the filling step is conducted under a partial vacuum.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Specific embodiments will now be described, by way of example only, with reference to the accompanying drawings, in which:

FIGS. 1-12 are shown to scale, however, other relative dimensions may be used if desired.

DETAILED DESCRIPTION

Figure 1:
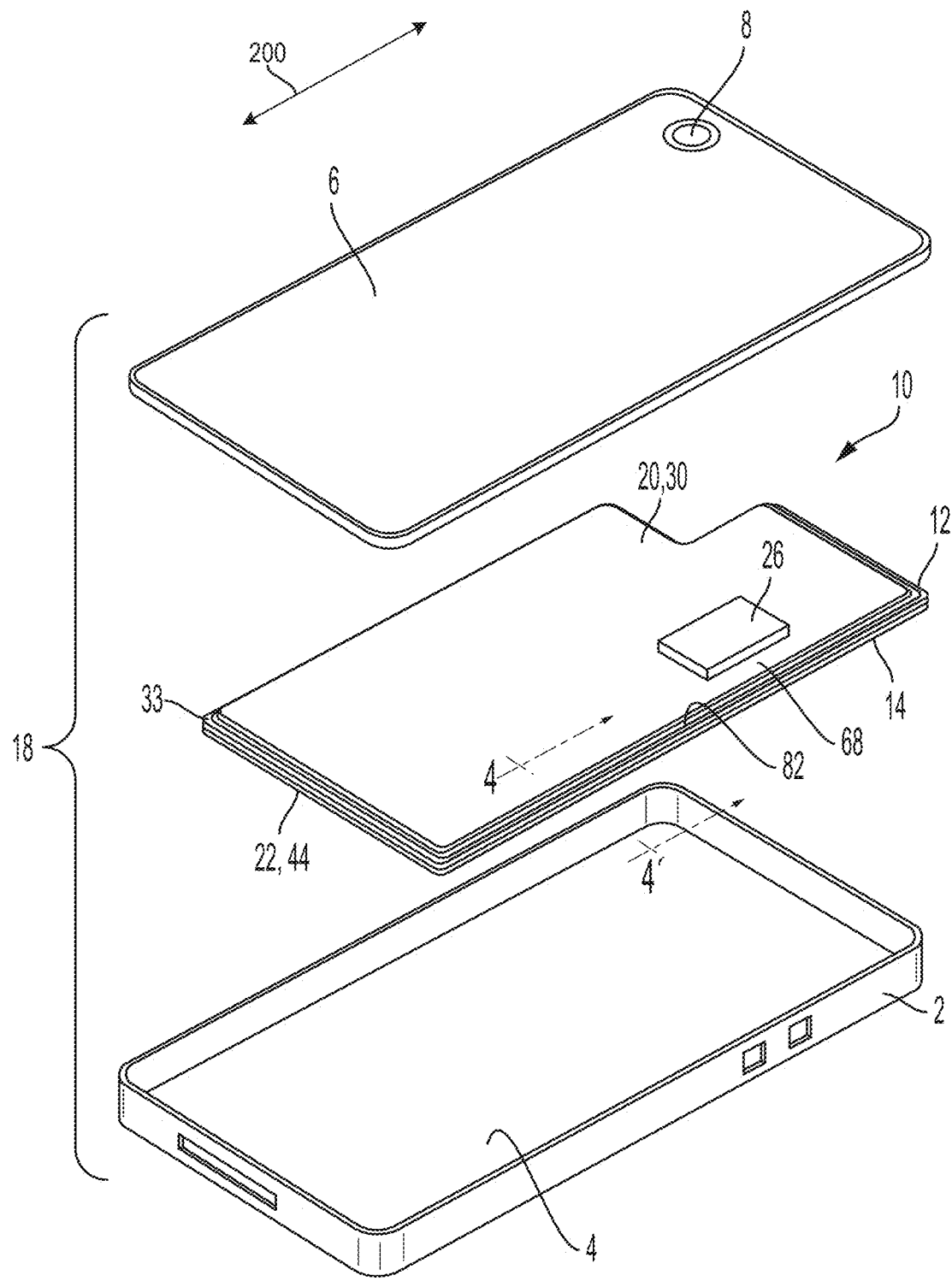
FIG. 1 is a top perspective view of a heat exchanger according to an embodiment described herein.

A number of embodiments of heat exchangers are described in the following description, along with descriptions of methods for manufacturing the heat exchangers. The embodiments specifically disclosed herein are vapor chambers for cooling electronic devices, however, the structural details and manufacturing methods disclosed herein may also be applicable to other types of heat exchangers.

The drawings illustrate a two phase heat exchanger 10 according to a first embodiment, wherein the heat exchanger 10 is a vapor chamber comprising a first plate 12, a second plate 14 and a wick material 16.

The heat exchanger 10 has an outer peripheral size and shape such that it will fit within the casing of a personal electronic device 18, the casing comprising a main body 2 having a front cover 4 and a rear cover 6, wherein the rear cover 6 fits over an open rear face of the front cover 4. That is to say, the open rear face of the front cover 4 may face toward and receive the rear cover 6. The personal electronic device 18 may comprise a smart phone, a tablet, a laptop or other personal computing and/or communications device. The heat exchanger 10 is generally flat and planar, having an upper surface 20 and a lower surface 22, and having a thickness ranging from about 100-2,000 micrometers, which may be adjusted within the range depending on the specific nature of the personal electronic device 18. For example, where the personal electronic device 18 is a relatively small device such as a smart phone, the thickness of heat exchanger 10 may be from about 100-400 micrometers, for example 100-300 micrometers. The heat exchangers 10 of larger devices such as tablets and laptops may be thicker than those of a smart phone. The heat exchanger 10 may include one or more cutouts 24 to accommodate elements of the personal electronic device 18, such as a camera lens 8, which is provided in the rear cover 6 shown in FIG. 1. In this way, the cutout of the heat exchanger may be configured to receive the camera lens 8.

Although heat exchanger 10 is shown in the drawings as being thin and generally flat, planar and rectangular, the heat exchangers disclosed and claimed herein are not demanded to have this configuration. The configuration of the heat exchanger 10 may vary according to the specific application for which it is intended to be used. For example, as already discussed above, the thickness of the heat exchanger 10 depends on the nature and size of the personal electronic device 18. The heat exchanger 10 may be non-rectangular, non-planar and/or of non-uniform thickness, at least partly depending on the shape and size of the heat-generating component to be cooled, and/or the size and nature of the personal electronic device 18.

In use, at least one heat-generating component 26 is received on the upper surface 20 of heat exchanger 10, either directly or via a substrate on which the heat-generating component 26 is mounted. Illustrated personal electronic device 18 has one such heat-generating component 26. The heat-generating component 26 may comprise the central processing unit (CPU) of the electronic device 18, the CPU having one or more processors, each processor comprising a computer chip. The electronic device 18 may include one or more processors, and may include other heat-generating components such as a rechargeable lithium-ion battery. In the present embodiment the heat-generating component 26 being cooled by the heat exchanger 10 is a single processor (CPU) comprising a computer chip, and therefore the heat-generating component 26 is sometimes referred to herein as a "computer chip". The heat-generating component 26 is shown in FIG. 1 as a flat rectangular prism having a surface area from about 100-225 $mm^2$, i.e. having dimensions of about 10×10 $mm^2$ to 15×15 $mm^2$, which is directly received on the upper surface 20 of heat exchanger 10. The local area of the heat exchanger 10 on which the heat-generating component 26 is received is shown by dotted lines in FIG. 2.

The first plate 12 has an inner face 28 which faces toward the interior of the heat exchanger 10, and an outer face 30 which defines either the upper or lower surface 20, 22 of the heat exchanger 10. The outer surface 30 may cover the inner surface 28, wherein the outer surface 30 may be in face-sharing contact with the open rear face of the front cover 4 and the rear cover 6. More specifically, the lower surface 22 is in face-sharing contact with the rear open face of the front cover 4 and the upper surface 20 is in face-sharing contact with the rear cover 6. As illustrated, the upper surface 20 and the lower surface 22 are opposite one another along the outer face 30. An outer peripheral edge of the first plate 12 is provided with a peripheral sealing surface 32 which is formed on a raised peripheral flange 33, wherein the peripheral sealing surface 32 is flat and planar and flange 33 is elevated relative to other areas of the inner face 28, wherein the height of the flange 33 is substantially the same as the height of the fluid chamber 34, such that the area of inner face 28 which is surrounded by sealing flange 32 partly defines a fluid chamber 34 enclosed between the first and second plates 12, 14. While this description is applicable to the present embodiment, it will be appreciated that the height of the fluid chamber 34 may not necessarily be the same as the height of the flange 33. For example, this may not be the case where the first plate 12 is non-planar or of non-uniform height.

Figure 2:
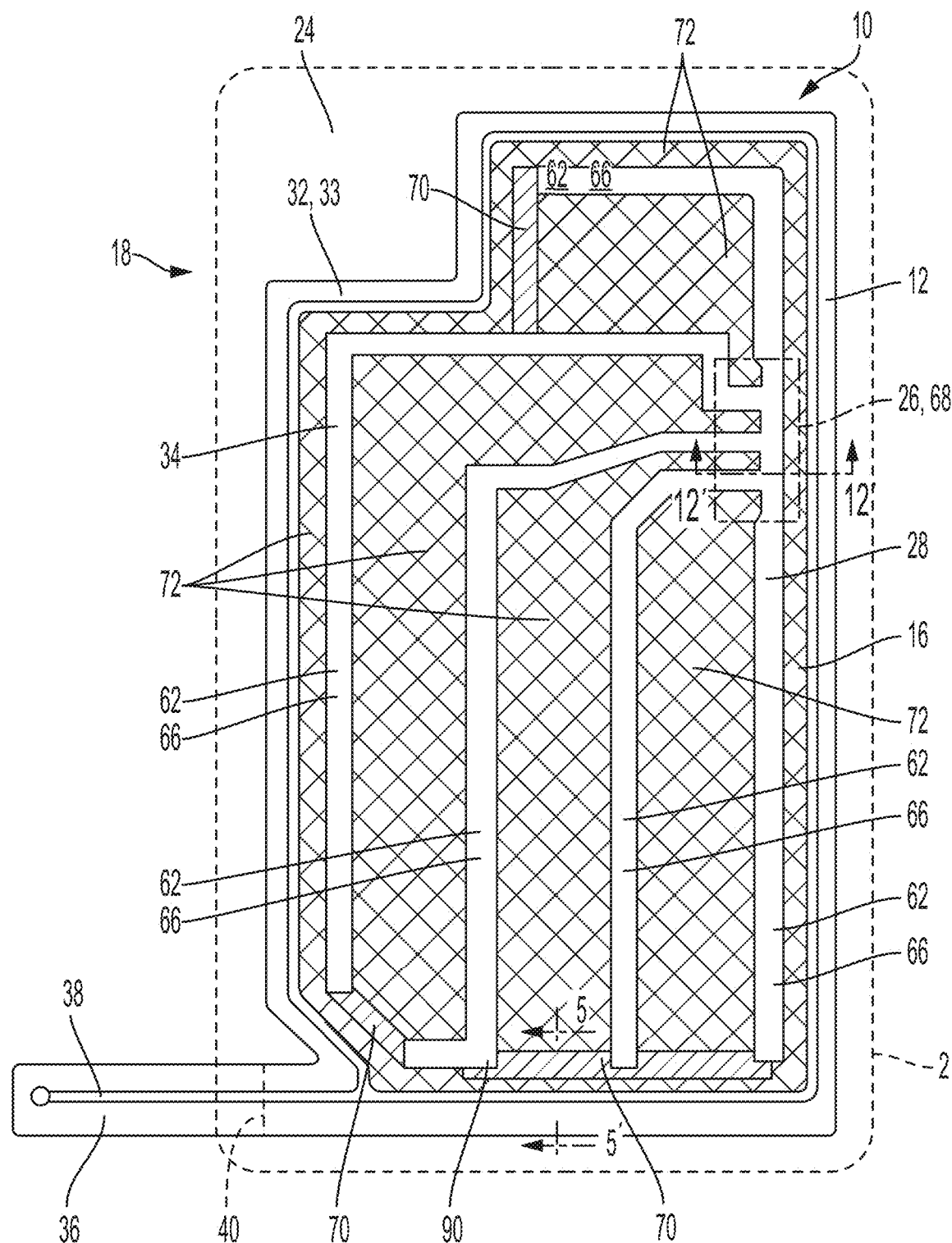
FIG. 2 is a plan view showing the interior of the heat exchanger of FIG. 1, with the second plate removed.
Figure 3:
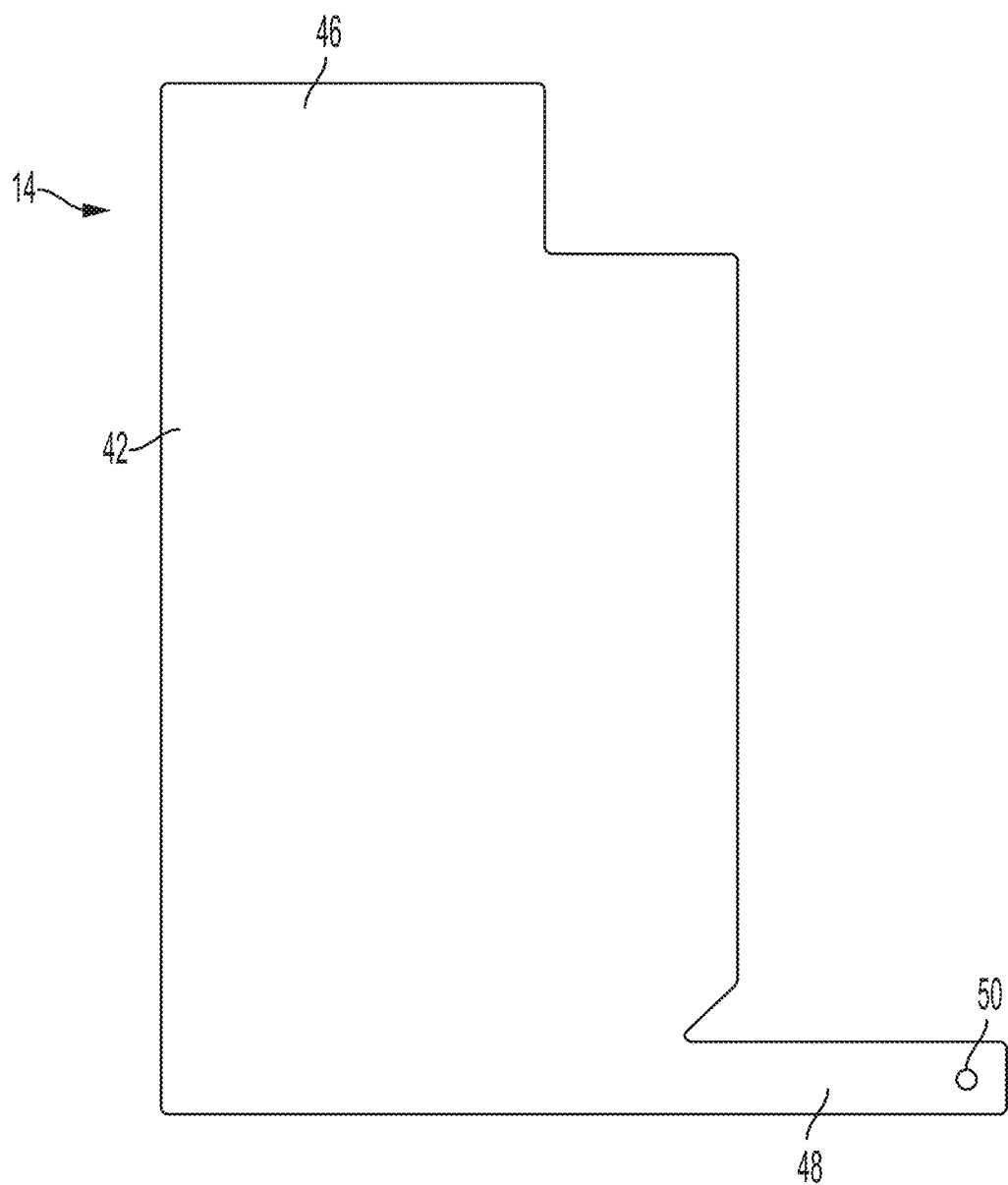
FIG. 3 is a plan view of the second plate of the heat exchanger of FIG. 1.
Figure 4:
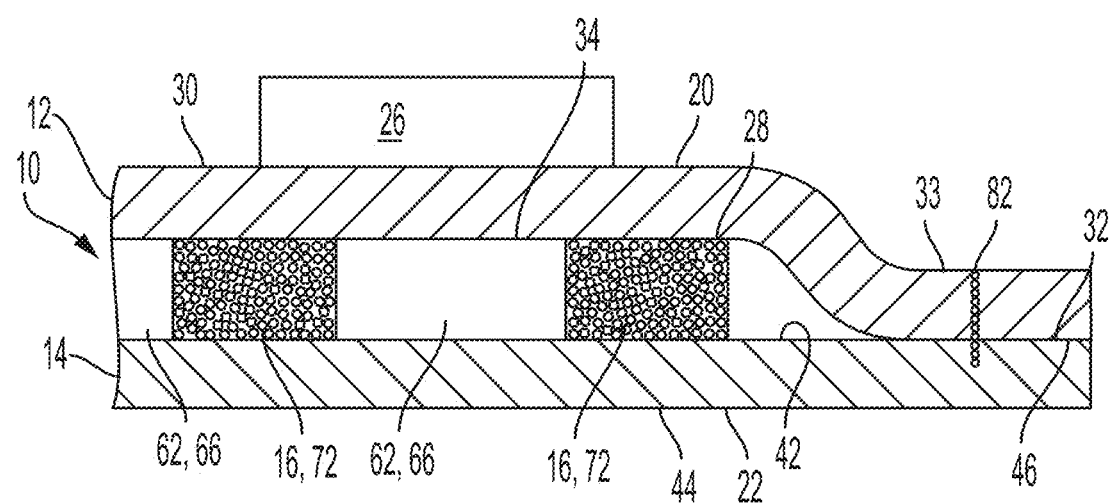
FIG. 4 is a cross-section along line 4-4' of FIG. 1.

As shown in FIG. 2, which includes where the outer surface 30 is omitted, the first plate 12 includes an extension portion 36 into which the sealing flange 32 extends, and which partly defines a fluid filling channel 38 in fluid flow communication with the fluid chamber 34. The fluid filling channel 38 extends outside the outline of the personal electronic device 18 and is present only for the purpose of filling the working fluid into the fluid chamber 34 during manufacturing. Once the fluid chamber 34 is filled, the extension portion 36 is cut off along seal line 40 with the fluid chamber 34 being sealed to prevent escape of the working fluid from the fluid chamber 34. The seal line 40 is indicated by a dotted line in FIG. 2. The working fluid may be water, however, other fluids may be used without departing from the scope of the present disclosure.

The second plate 14 may have the same size and shape as the first plate 12, having an inner face 42 which faces toward the interior of the heat exchanger 10, and an outer face 44 which defines either the upper or lower surface 20, 22 of the heat exchanger 10. An outer peripheral edge of the second plate 14 is flat and planar to provide a peripheral sealing surface 46 on the inner face 42 which is adapted to be sealed to the sealing surface 32 of first plate 12. In the present embodiment, the peripheral sealing surface 46 may be co-planar with the remainder of the inner face 42, wherein the areas of inner face 42 which are surrounded by sealing surface 46 partly define the fluid chamber 34.

Some of the drawings show that the heat-generating component 26 is received on the outer face 30 of the first plate 12, which therefore defines the upper surface 20 of the heat exchanger 10. However, since both plates 12, 14 in the present embodiment are generally flat and planar, the heat-generating component 26 may instead be received on the outer face 44 of the second plate 14, either directly or via a substrate on which it is mounted, in which case the outer face 44 of the second plate 14 will define the upper surface 20 of the heat exchanger 10 on which the heat-generating component 26 is supported.

The embodiment described herein includes one substantially planar plate 14 which is bonded to a plate 12 having a raised peripheral sealing flange 33 extending from a planar portion of the outer surface 30. In some embodiments, additionally or alternatively, the arrangement shown herein may comprise where both the first and second plates 12, 14 could both be formed with raised peripheral sealing flanges 33 which are mirror images of one another, with the combined heights of the flanges 33 of the first and second plates 12, 14 being substantially the same as the height of the fluid chamber 34.

The second plate 14 includes an extension portion 48 having the same outer dimensions as the extension portion 36 of first plate 12. The extension portion 48 of second plate 14 may be flat and is adapted to seal to the extension portion 36 of first plate 12, and partly defines the fluid filling channel 38. The extension portion 48 of second plate 14 has a hole 50 through which the fluid is injected into channel 38, the hole 50 being aligned with the end of the fluid filling channel 38, which may optionally have an enlarged bulbous form.

The first and second plates 12, 14 may be comprised of stainless steel, which is more rigid and less expensive than conventional materials (e.g., material used in previous examples) such as copper. As described in more detail in above-mentioned U.S. patent application Ser. No. 16/047,484, the first and second plates 12, 14 each comprise a core layer of stainless steel, with continuous inner and outer clad layers of other metals along its inner face 28, 42 and optionally along its outer face 30, 44. The inner clad layer comprises a metal having a melting temperature lower than that of the stainless steel core layer, and which is inert to the working fluid, such as copper or nickel. The inner clad layer may be very thin, being about 2-10 percent by thickness, typically about 3-4 percent by thickness, of each of the first and second plates 12, 14. For example, the thickness of each clad layer may be on the order of about 1-10 microns. The optional outer clad layer may differ in composition from the inner clad layer and may be selected from a corrosion resistant metal such as copper or nickel. The outer clad layer may have the same or similar thickness as the inner clad layer, i.e. about 2-10 percent by thickness, typically about 3-4 percent by thickness, of each of the first and second plates 12, 14.

The wick material 16 is received inside the fluid chamber 34 between the inner face 28 of the first plate 12 and the inner face 42 of the second plate 14. In the present embodiment the wick material 16 comprises a sintered, structural wick material comprised of a metal which is inert to the working fluid, such as copper or nickel. The wick material 16 may have a thickness of about 100-300 micrometers, and is desirably as thin as possible so as to minimize the thickness of the heat exchanger 10. At least some areas of the wick material 16, are in contact with the inner faces 28, 42 of the first and second plates 12, 14, as further discussed below.

The heat exchanger 10 and wick material 16 include a plurality of liquid flow passages 72 in which the wick material 16 is hydrophilic and comprises a large number of small pores within which capillary forces are generated to cause circulation of the liquid working fluid through the wick material 16. For example, the wick material 16 may be about 25-75% porous in the liquid flow passages 72, for example about 60-75%. The liquid flow passages 72 are spaced apart across the area of the heat exchanger 10 and either traverse or terminate within the area 68 of the heat exchanger 10 (indicated by dotted lines in FIG. 2) on which the heat-generating component 26 is supported and which directly receives heat energy from heat-generating component 26 by conduction through first plate 12, referred to herein as the "evaporation zone 68". Liquid flow passages 72 deliver the condensed working fluid to the evaporation zone 68 from other areas of the heat exchanger 10. In one example, an axis extends directly through each of the heat-generating component 26 and the evaporation zone 68.

At least in the liquid flow passages 72, the thickness of the wick material 16 is such that it extends throughout the full height of the fluid chamber 34, with the top and bottom surfaces of the wick material 16 in contact with the inner faces 28, 42 of the first and second plates 12, 14, thereby providing structural support for the first and second plates 12, 14 and eliminating the need for support ribs and/or support columns, as further described below. In addition, conduction of heat from heat-generating component 26 through the first plate 12 into the wick material 16 is enhanced by contact between the wick material 16 and the inner face 28 of first plate 12 in the liquid flow passages 72.

The heat exchanger 10 and wick material 16 also include a plurality of primary gas flow passages 62, 66 and secondary gas flow passages 70 for circulation of the gaseous working fluid. The primary gas flow passages 62, 66 are spaced apart across the area of the heat exchanger 10 and either traverse or terminate within the evaporation zone 68, and are configured to allow the gaseous working fluid to flow away from the evaporation zone 68 toward the outer periphery of the heat exchanger 10, to effectively distribute and dissipate the heat generated by the heat-generating component 26 throughout the surface area of device 18. In the present example, heat exchanger 10 includes five primary gas flow passages 62, 66, each having an open first end in flow communication with the evaporation zone 68 and with the open first ends of the other primary gas flow passages 62, 66.

Each of the secondary gas flow passages 70 interconnects two or more primary gas flow passages 62, 66, thereby providing improved flow distribution of the gaseous working fluid across the surface area of heat exchanger 10.

With this configuration, gaseous working fluid generated in the evaporation zone 68 will flow away from the evaporation zone 68 through the primary and secondary gas flow passages 62, 66, 70 toward the outer edges of the heat exchanger 10. As the gaseous working fluid flows away from the heat-generating component 26 into cooler areas of the heat exchanger 10, its temperature drops. Once the temperature of the working fluid falls to the condensation temperature, the gaseous working fluid condenses to the liquid state, releasing the heat of condensation across the surface of the heat exchanger 10. The condensed liquid working fluid in the gas flow passages 62, 66, 70 is drawn into the liquid flow passages 72 and circulates back toward the evaporation zone 68. In one example. The evaporation zone 68 may be in a similar position as the heat-generating component 26. Additionally or alternatively, the evaporation zone 68 may be in a position aligned with the heat-generating component 26 in a different location (see FIG. 12).

Due to the elongate shape of the personal electronic device 18 and the location of heat-generating component 26 near one end, the gas flow passages 62, 66, 70 and the liquid flow passages 72 extend primarily in a direction which is parallel to the long sides of the heat exchanger 10, i.e. the longitudinal direction shown by double headed arrow 200. However, some portions of the gas flow passages 62, 66, 70 and the liquid flow passages 72 extend transversely to the long sides of heat exchanger 10 in order to distribute the gas flow and liquid flow across the width of the heat exchanger 10. For example, a pair of transverse secondary gas flow passages 70 are provided near the end of the heat exchanger 10 remote from the evaporation zone 68. The transverse secondary gas flow passages 70 connect the ends of the primary gas flow passages 62, 66 extending longitudinally through the heat exchanger 10, in order to provide uniform fluid distribution and heat distribution throughout the entire surface area of the heat exchanger 10, effectively forming a transverse gas distribution zone 90 extending transversely across the heat exchanger 10 proximate to the end of heat exchanger 10 which is distal to the evaporation zone 68. It will be appreciated that the patterns of gas flow passages 62, 66, 70 and liquid flow passages 72 are dependent on the shape of the device 18 and the specific location of the heat-generating component 26 within the device 18, and are therefore variable.

Figure 5:
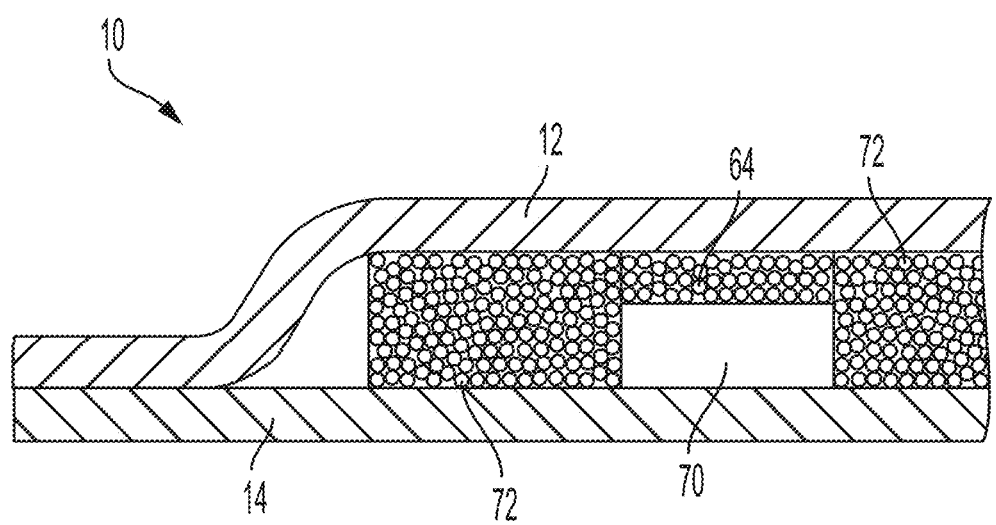
FIG. 5 is a cross-section along line 5-5' of FIG. 2.

The primary and secondary gas flow passages 62, 66, 70 may comprise void areas and/or may include one or more areas 64 in which the height or thickness of the wick material 16 is less than the height of the fluid chamber 34, such that a gap exists between the top surface of the wick material 16 and the inner face 28 of the first plate 12, and/or between the bottom surface of the wick material 16 and the inner face 42 of the second plate 14. These areas 64 are referred to herein as "reduced-height areas". In each of the reduced-height areas 64, gas flow is permitted above and/or below the reduced-height area 64. For example, the cross-section of FIG. 5 shows one of the reduced-height areas 64 provided in a secondary gas flow passage 70, and extending between a pair of liquid flow passages 72.

Providing reduced-height areas 64 in the primary and/or secondary gas flow passages 62, 66, 70 allows the wick material 16 to be provided in the form of a single sheet which simplifies placement and proper location of wick material 16 between the plates 12, 14 during manufacturing. As will be further discussed below, the reduced-height areas 64 can be formed by various elements, for example by molding, compression, and/or by incorporating non-porous strips or sheets of metal material in the wick material 16.

At least partly due to the location of the heat-generating component 26 and the overall shape of the heat exchanger 10, the primary gas flow passages 62, 66 may have different lengths and widths. The primary gas flow passages 62, 66 may also have different overall shapes, wherein one or more of the primary gas flow passages 62, 66 may be straight and one or more of the primary gas flow passages 62, 66 may have one or more angular or curved bends. In embodiments where each primary gas flow passage 62, 66 has only one open end (i.e. the first open end) at which they communicate with one another, for example in evaporation zone 68, the amounts of gas flowing into the primary gas flow passages 62, 66 will be different due to the different lengths, widths and dimensions of the primary gas flow passages 62, 66. In other words, the amount of gas that enters each primary gas flow passage 62, 66 will be gauged in accordance with the pressure drop specific to that passage. Having differences in pressure drop and fluid flow in different areas of the heat exchanger 10 can lead to decreased efficiency and decreased temperature uniformity across the surface of the heat exchanger 10.

The secondary gas flow passages 70 connect each of the primary gas flow passages 62, 66 to one or more other primary gas flow passages 62, 66, such that all the primary gas flow passages 62, 66 are interconnected at areas which are distal from the evaporation zone 68. For example, in heat exchanger 10, each of the primary gas flow passages 62, 66 has first and second opposed ends, wherein the first end is located in the evaporation zone 68 where it is in open flow communication with the first ends of the other primary gas flow passages 62, 66, and the second end may be in open flow communication with at least one other primary gas flow passage 62, 66 through one of the secondary gas flow passages 70, to balance flow and pressure drop in the primary gas flow passages 62, 66.

The liquid flow passages 72 similarly have first and second ends, with the first end of each liquid flow passage 72 being located in the evaporation zone 68. In the present embodiment, the first ends of at least some of the liquid flow passages 72 may be combined together within or adjacent to the evaporation zone 68, and the second end of each liquid flow passage 72 is in open flow communication with at least one of the liquid flow passages 62, 66 and/or at least one of the secondary gas flow passages 70.

Thus, the provision of secondary gas flow channels 70 communicating with the second ends of the primary gas flow passages 62, 66 and the liquid flow passages 72 balances the gas and liquid flow across the heat exchanger 10, and also balances the pressure drop. This reduces the overall pressure drop and allow for more effective use of the entire area of the heat exchanger 10, providing better efficiency and temperature uniformity. Furthermore, in a system having two or more heat-generating components 26, the provision of secondary gas flow passages 70 will help balance the flow in the primary gas flow passages 62, 66 and liquid flow passages 72 independent of the heat loads of each of the evaporation zones 68.

As mentioned above, the formation of conventional wicking elements from one or more layers of wire mesh involves increased trimming and formation of cut-outs, generating large amounts of in-process scrap, which is inefficient and time-consuming. In contrast, heat exchanger 10 described herein includes a wick material 16 comprising a sintered, structural wick material comprised of an inert metal such as copper or nickel. The wick material 16 is in contact with the inner faces 28, 42 of the first and second plates 12, 14, and has a compression resistance to provide structural support for first and second plates 12, 14, and to maintain a constant spacing between plates 12, 14, for example during filling and/or use of the heat exchanger 10, during which the fluid chamber 34 may be under a partial vacuum.

Figure 7:
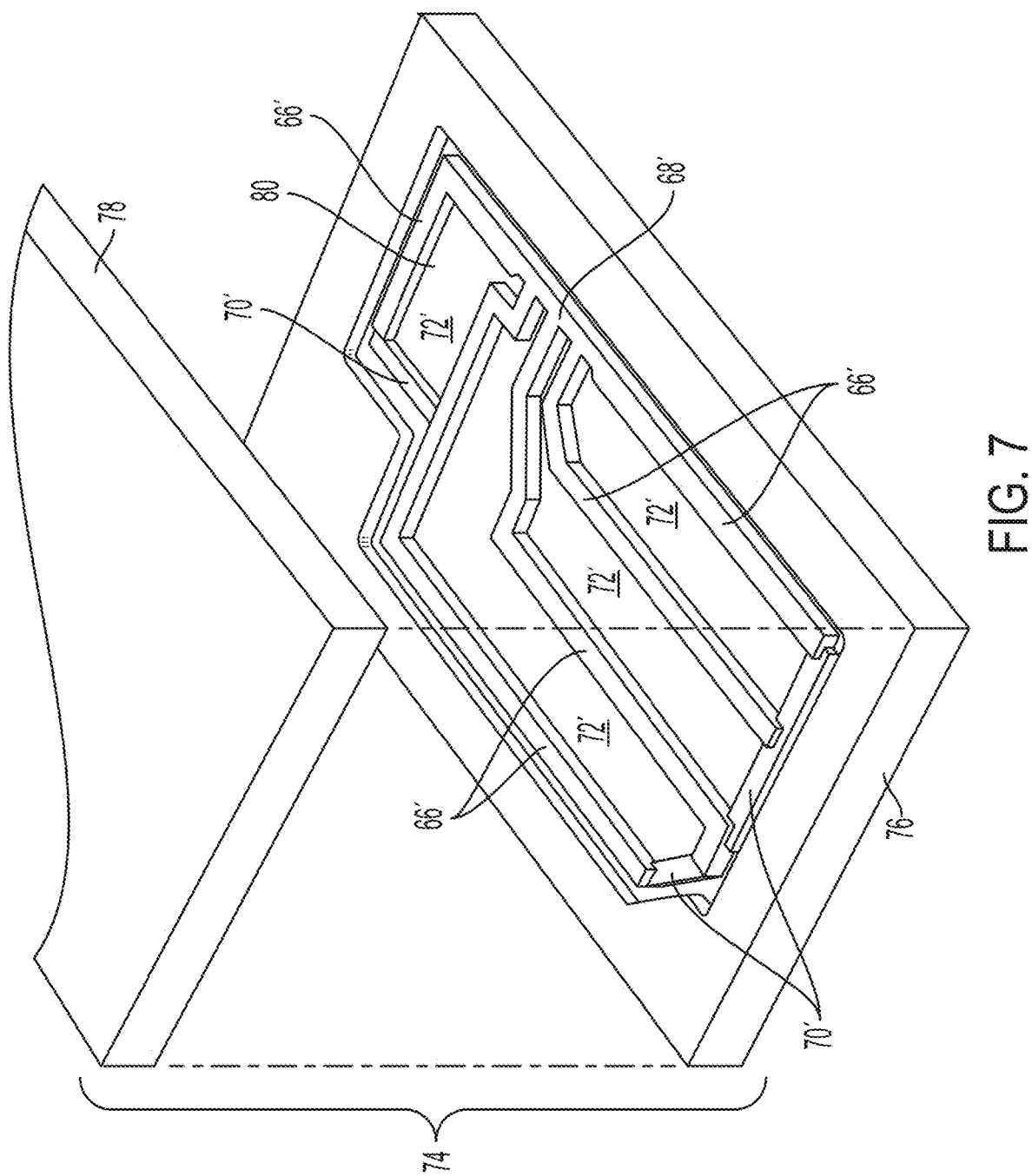
FIG. 7 is a schematic illustration of a mold for molding a sintered wick material.

The wick material 16 may be formed in a form or a mold 74 as shown in FIG. 7, having first and second mold portions 76, 78 between which the wick material 16 is molded. The first mold portion 76 includes a mold cavity 80 including a pattern of raised areas and depressions corresponding to the pattern of liquid flow passages 72 and gas flow passages 68, 70 of wick material 16. These raised and depressed areas are labelled with primed numbers of the corresponding portions of the wick material 16. The inner face (not visible in FIG. 7) of the second mold portion 78 may be flat. As there will be some amount of shrinkage during the sintering process, the mold 74 will be larger than the final wick material 16, for example by about 10%, to account for shrinkage.

The powder particles are poured into the mold cavity 80 and are sintered by the application of heat and/or pressure to the powder particles in the mold 74. For example, the particles may be sintered by heating the powder particles in the mold 74 in a controlled atmosphere until the powder particles bind together to form a sheet of wick material 16. The porosity and the shapes of the pores are dependent on the size and shape of the particles making up the wick material 16, and also the sintering time, temperature and pressure. For example, the pores of the wick material 16 comprise gaps between the sintered particles. Therefore, the pore size is at least partly determined by the size (diameter) of the powder particles, and increases with increasing particle diameter. In an example where the powder particles are spherical, they may have a diameter of from about 10-100 microns, and dendritic powder particles may have a diameter from about 60-200 microns.

The sintering of the metal particles effectively locks them in position relative to one another, providing the wick material 16 with sufficient rigidity, such that when a sheet of sintered wick material 16 is placed between the first and second plates 12, 14 of heat exchanger 10, with the top and bottom surfaces of the wick material 16 in contact with the inner faces 28, 42 of plates 12, 14, the wick material 16 resists compression of the heat exchanger 10. The compressive strength of the wick material 16 provides the heat exchanger 10 with sufficient structural rigidity to reduce or eliminate the need for structural support ribs and/or support columns.

Figure 8:
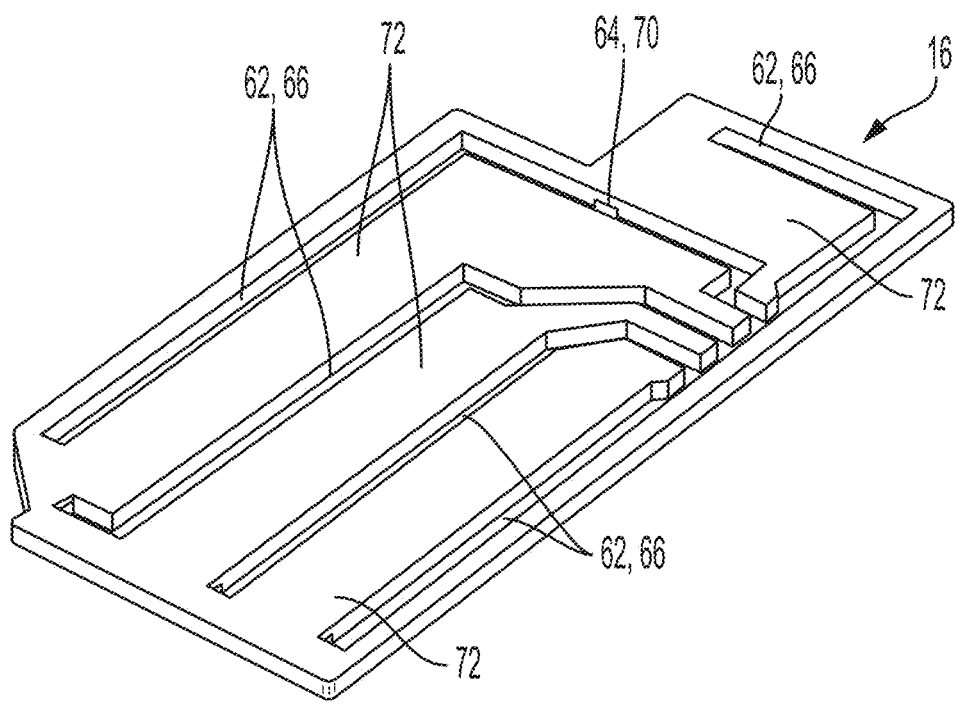
FIG. 8 is a top view of a sintered wick material produced in the mold of FIG. 7.
Figure 9:
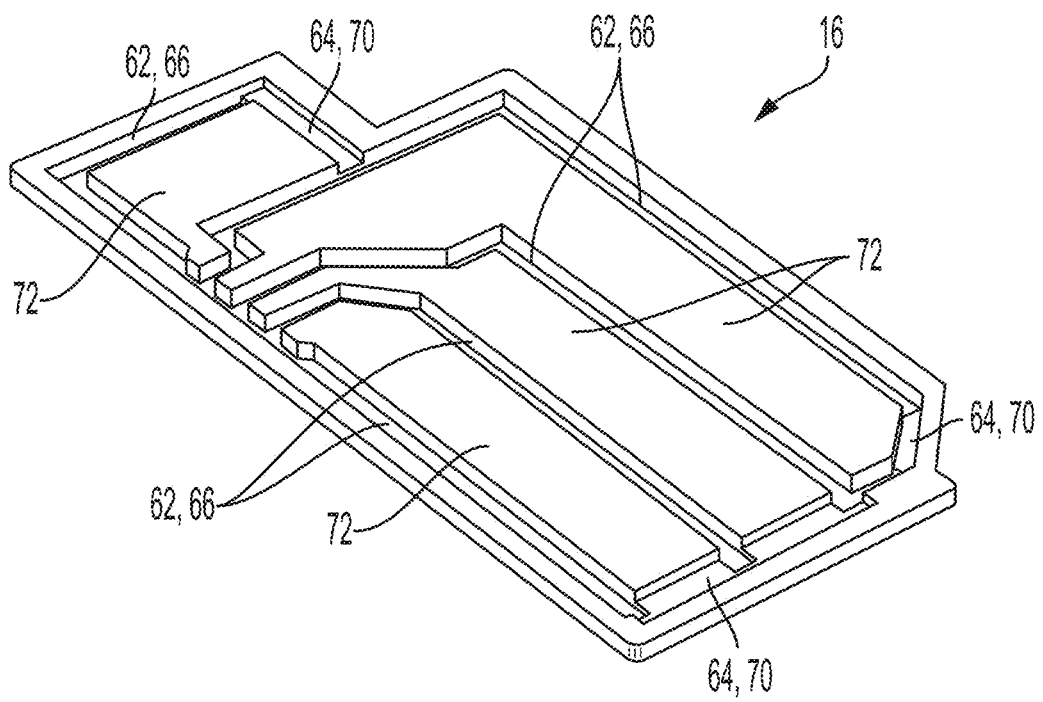
FIG. 9 is a bottom view of the sintered wick material shown in FIG. 8.

Top and bottom views of a sintered structural wick material 16 formed in mold 74 are shown in FIGS. 8 and 9. An advantage of forming the wick material 16 by molding and sintering is that void areas of the wick material 16 are produced by an absence of material in the void areas, rather than by removal of material from these areas. These void areas correspond to primary gas flow passages 62, 66 of the wick material 16, and the raised areas 66' of the first mold portion 76 shown in FIG. 7. In addition, the outer edges of the wick material 16 are created by molding rather than by trimming the wick material 16 from a larger sheet, as they are defined by the outer periphery of the mold cavity 80. Therefore, little or no trimming or material removal is involved in the formation of the sintered wick materials 16 described herein, greatly reducing waste and material costs.

Heat exchanger 10 and wick material 16 include at least one reduced-height area, and in the present embodiment include a plurality of reduced-height areas 64, which are shown in FIGS. 2 and 5, and which at least partly define the plurality of secondary gas flow passages 70 in the present embodiment.

In order to form the reduced-height areas 64 corresponding to secondary gas flow passages 70, the first mold portion 76 includes corresponding reduced-height portions 70', each of which has an upper surface which is spaced above the depressed areas 72' and below the raised areas 66'. In some embodiments, the reduced-height areas 64 of the wick material 16 may be formed from the same metal powder as the remainder of the wick material 16, and simultaneously molded with the remainder of the wick material 16. In such embodiments, for example as shown in FIG. 5, the reduced-height portions 64 may have the same composition and porosity as the liquid flow passages 72, and therefore liquid working fluid may be transported through the reduced-height portions 64 while gaseous working fluid flows above and/or below the reduced-height portions 64.

Figure 10:
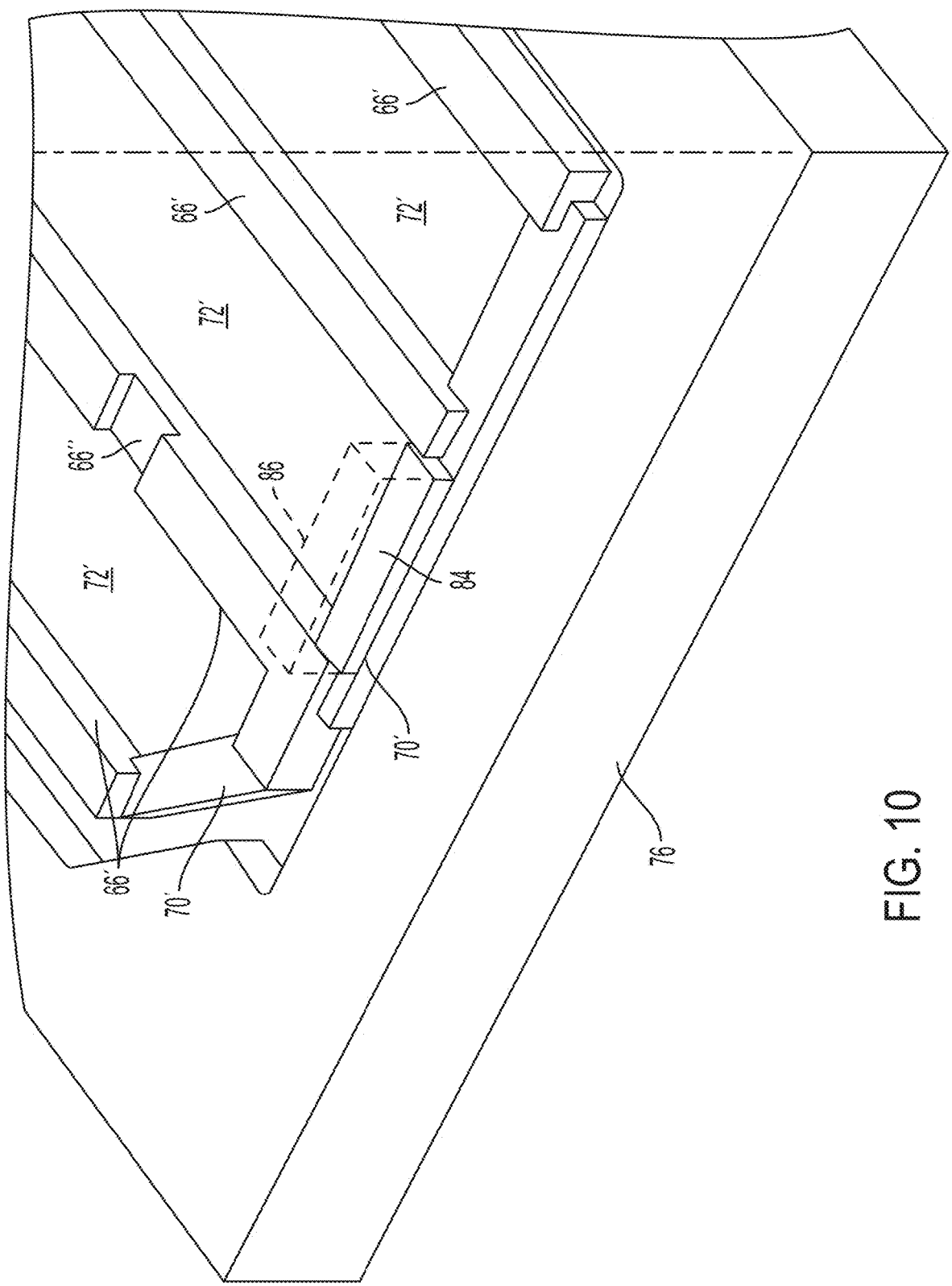
FIG. 10 is an enlarged, partial close-up a modified version of the mold of FIG. 7.

It will be appreciated that the reduced-height portions 64 may instead or additionally be formed throughout areas of the primary gas flow passages 62, 66, for example by providing reduced-height areas within one or more raised areas 66' of mold cavity 80, such as reduced-height area 66" shown in FIG. 10. Such reduced-height areas 66" may be provided in one or more of the raised areas 66' which converge in area 68', corresponding to evaporation zone 68, to join together the first ends of the multiple liquid flow passages 72. Forming these reduced-height areas of the wick material 16 by molding may avoid the need for a subsequent compression step to form the reduced-height areas.

Figure 11:
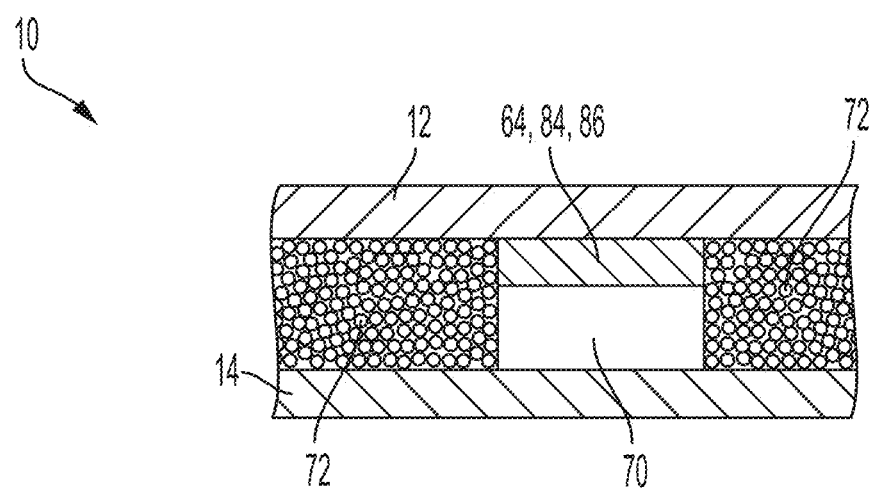
FIG. 11 is a partial cross-section of a sintered wick material produced in the mold of FIG. 10.

In some embodiments, the reduced-height areas of the wick material 16 can be formed so as to be non-porous. For example, as shown in FIG. 10, a non-porous strip 84 of metal material may be placed into the mold cavity 80 on top of a reduced-height area 70', as shown in FIGS. 10 and 11, such that the reduced-height area 64 defined by non-porous strip 84 is non-porous and non-wicking. Alternatively, the reduced-height area 64 can be formed from a metal powder with particles of different (i.e. smaller) diameter, as compared to the metal powder forming the liquid flow passages 72. As explained above, smaller diameter particles will result in a smaller pore size, and lower porosity.

In yet other embodiments, the thickness and/or porosity of any portion of the wick material 16 can be adjusted by a compression step either during or after the molding operation, whereby at least a portion of the sintered wick material 16 is compressed so as to reduce its thickness. For example, as shown in FIG. 11, the non-porous strip 84 can be replaced by a thicker section of sintered metal powder 86, for example up to three times thicker than the remainder of the wick material 16, and three times greater than the depth of areas 72'. The thicker section of sintered metal powder 86 may or may not have the same composition as the sintered metal powder comprising the remainder of the wick material 16. Subsequent compression of the thicker section 86, for example to same height as areas 66', will reduce its porosity relative to that of portions of wick material 16 which are either not compressed or compressed to a lesser degree.

Compression during or after molding may also be used to produce areas of wick material 16 having a reduced thickness, for example where fluid chamber 34 of heat exchanger 10 varies in height throughout its area.

After formation of the wick material 16 by molding, with or without a subsequent compression operation, the wick material 16 is placed between the first and second plates 12, 14. The first and second plates 12, 14 are then sealingly joined together as described below, with the top and bottom surfaces of the wick material 16, at least in the wicking areas, being in contact with the inner faces 28, 42 of the first and second plates 12, 14.

During or subsequent to the joining process, the wick material 16 may become metallurgically bonded to the inner face 28 of the first plate 12 and/or the inner face 42 of the second plate 14. For example, in one embodiment, the wick material 16 may be sintered to the inner face 28 or 42 of one of the plates 12 or 14 before the plates 12 and 14 are joined together. For example, the wick material 16 may be metallurgically bonded to the inner face 28 of the first plate 12 in this manner to improve heat transfer between the heat-generating component 26 and the portions of the wick material 16 located in the evaporation zone 68. Metallurgical bonding may also help the heat exchanger 10 resist vertical expansion or "ballooning" due to pressurization caused by evaporation of the working fluid at high temperatures.

Figure 12:
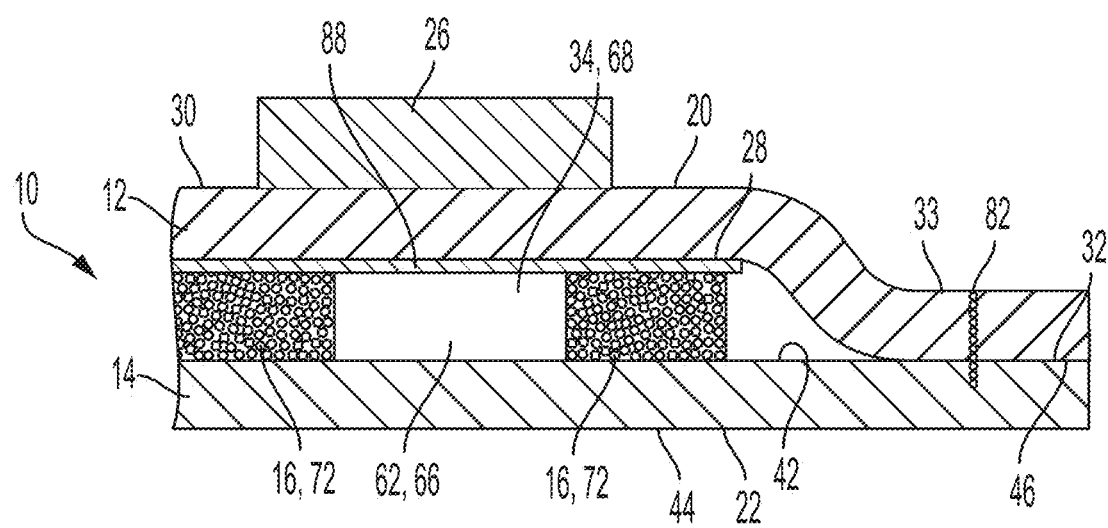
FIG. 12 is a cross-section along line 12-12' of FIG. 2, the heat exchanger further including a conductive patch according to another embodiment.

In another embodiment, shown in the cross-section of FIG. 12, there is provided a conductive patch 88 having a first surface which is metallurgically bonded to the inner face 28 of the first plate 12, with the heat-generating component 26 supported on the outer face 30 of the first plate 12, and an opposite second surface in contact with the sintered wick material 16. The conductive patch 88 may be at least partly located directly opposite to the heat-generating component 26, and may be located in the evaporation zone 68 of the fluid chamber 34. In one example, the conductive patch 88 is arranged directly between the heat-generating element 26 and the evaporation zone 68. The metallurgical bond between the conductive patch 88 and the inner face 28 of first plate 12 may be formed by brazing the conductive patch 88 to the inner face 28, which may be provided with an inner clad layer as described above.

In some embodiments, the conductive patch 88 may occupy part or all of the area of the evaporation zone 68, and may occupy substantially the entire area of the evaporation zone 68. The conductive patch 88 may be metallurgically bonded to the first plate 12 before the two plates 12, 14 are joined together, and before the remainder of the wick material 16 (e.g. the portion of wick material 16 formed by molding) is laid into the fluid chamber 34.

The conductive patch 88 is shown as being thinner than the remainder of the wick material 16, although the thickness of conductive patch 88 may be greater than shown in FIG. 12. Depending on the thickness of conductive patch 88, the portion of sintered wick material 16 in contact with conductive patch 88 may be reduced in thickness by molding and/or by compression, as described above. The conductive patch 88 is comprised of a metal which is inert to the working fluid, such as copper or nickel, and may have a solid non-porous structure, or a sintered structure such as the remainder of the wick material 16. The inventor has found that providing the wick material 16 with a metallurgically bonded conductive patch 88 as described herein provides improved heat transfer between the heat-generating component 26 and the wick material 16.

Figure 6A:
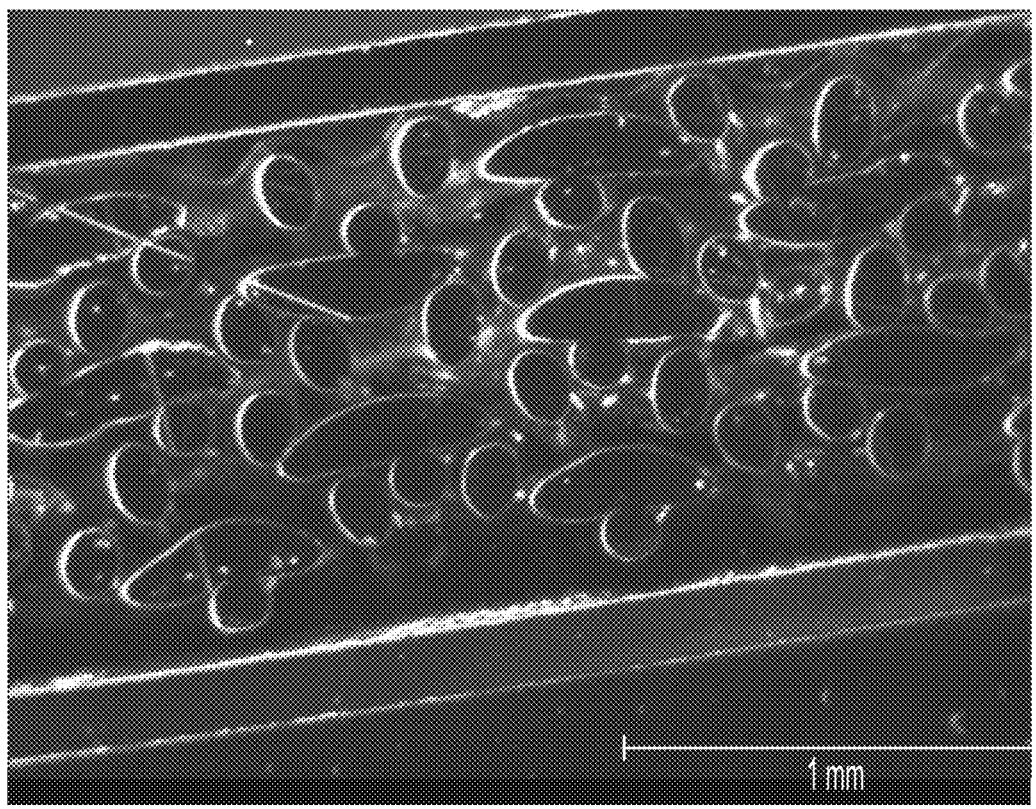
FIG. 6A is a photomicrograph of a wire mesh wick material at 63× magnification.
Figure 6B:
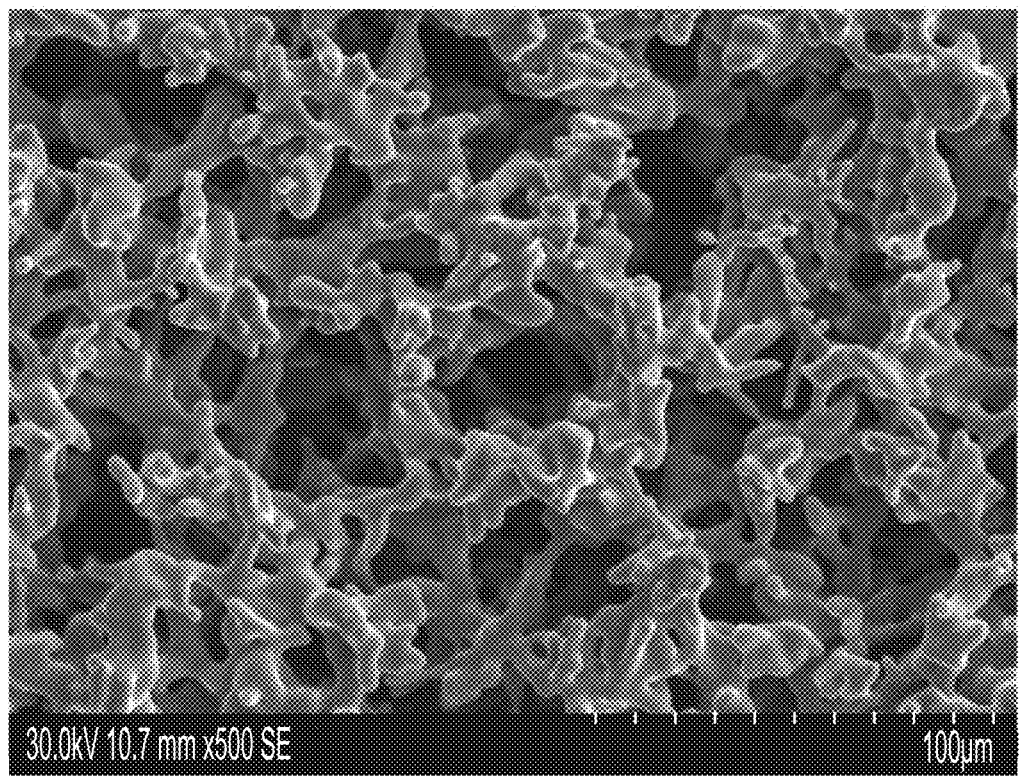
FIG. 6B is a photomicrograph of a 100 micron sintered dendritic copper wick material at 500× magnification.
Figure 6C:
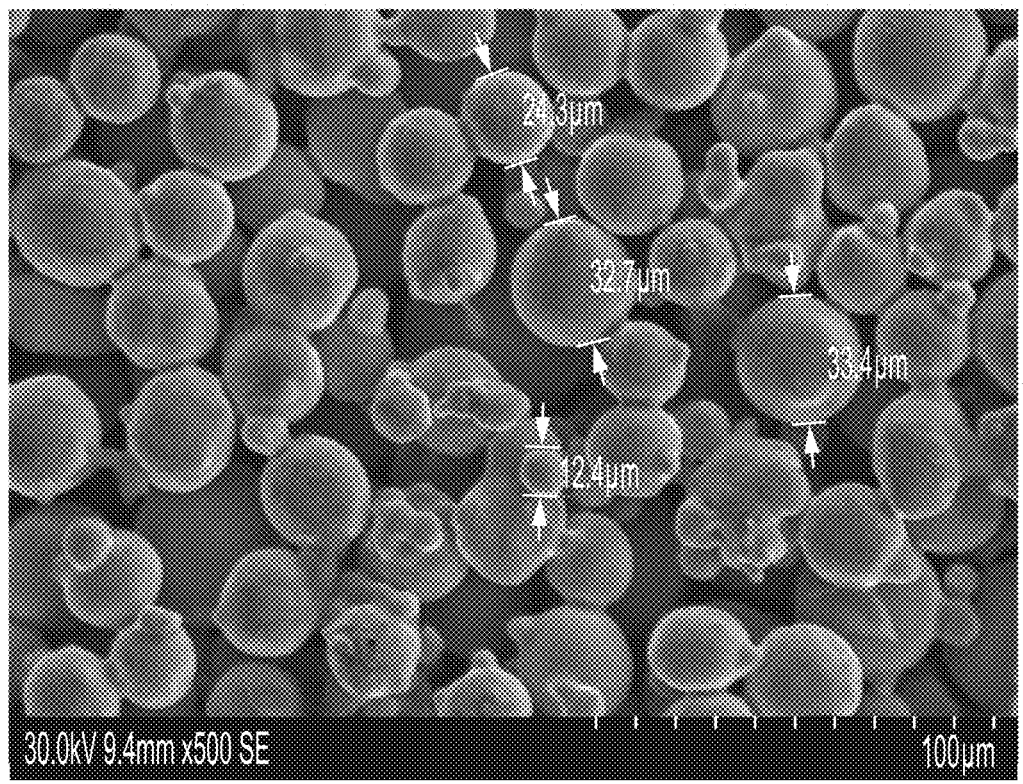
FIG. 6C is a photomicrograph of a 10-30 micron sintered copper ball wick material at 500× magnification.

FIGS. 6A, 6B and 6C are photomicrographs showing a sample of wire mesh (FIG. 6A) at 63× magnification, compared with sintered materials (FIGS. 6B and 6C) at 500× magnification. The sintered materials are 100 micron sintered dendritic copper (FIG. 6B) and sintered 10-30 micron copper balls (FIG. 6C). The wire mesh of FIG. 6A comprises five layers of 0.0045 copper wire, comprising 100 wires/inch compressed to 850 microns.

As described in above-mentioned U.S. patent application Ser. No. 16/047,484, the first and second plates 12, 14 of the heat exchanger 10 may be sealingly joined together by laser beam welding (LBW), a welding technique in which the first and second plates 12, 14 are joined together through use of a laser having a high power density (up to about 3 MW/cm$^2$, typically greater than about 0.7 MW/cm$^2$), resulting in small heat-affected zones, high heating and cooling rates, and making LBW suitable for high volume applications. The spot size or beam width of the laser is small (for example about 20-80 microns), to produce a narrow weld joint 82, and the power, speed and length of the pulses can be varied to weld materials of different thicknesses, with lower powers and higher speeds used to weld thin materials. Weld speeds may range from 100 to 1,000 mm/sec, and therefore a heat exchanger 10 having 700 mm of total weld length can be welded in less than 2 seconds.

The heat exchanger 10 is described herein as being flat and planar. It will be appreciated, however, that the heat exchanger 10 may instead be non-planar and/or of variable thickness, depending upon the specific application in which it is used. In one example, the heat exchanger 10 is molded at a first thickness, where the heat exchanger 10 is stamped (e.g., compressed) to adjust its thickness to a second thickness less than the first thickness. The second thickness may correspond to a desired final thickness of the heat exchanger 10 whereas the first thickness may correspond to a thickness greater than a plurality of desired final thicknesses across a variety of uses of the heat exchanger 10. In this way, a thickness of the heat exchanger 10 is adjustable to match a variety of conditions.

Although the heat-generating component 26 described in the above embodiment comprises a single computer chip, it will be appreciated that the heat exchanger 10 described herein can be used for cooling a wide variety of heat-generating electronic components, and may be used for cooling more than one heat-generating component in a single personal electronic device 18. For example, the heat exchanger 10 described herein may provide heat dissipation and cooling for batteries of personal electronic devices 18, for which 50° C. is about the maximum temperature that a battery can withstand before swelling occurs. Therefore, the heat exchanger 10 may also be used to provide improved uniformity in battery temperatures of personal electronic devices 18, particularly during fast charging.

It will be appreciated that references to copper and nickel in the present disclosure include pure copper and nickel, and alloys thereof. Also, it will be appreciated that references to copper as a metal included in any components of heat exchanger 10 include oxygen-free copper.

While certain embodiments of heat exchangers have been described herein, it will be understood that certain adaptations and modifications of the described embodiments can be made. Therefore the embodiments described above are considered to be illustrative and not restrictive.

In one example, a heat exchanger for thermal management of a heat-generating component, the heat exchanger having a first surface adapted for thermal contact with the heat-generating component, an opposed second surface, and an interior defining a fluid chamber containing a working fluid, wherein the heat exchanger comprises a first plate having an inner face which faces toward the interior of the fluid chamber, an outer face which defines either the first or second surface of the heat exchanger, and an outer peripheral sealing surface on the inner face of the first plate. The heat exchanger further comprises a second plate having an inner face which faces toward the interior of the fluid chamber, an outer face which defines either the upper or lower surface of the heat exchanger, and an outer peripheral sealing surface on the inner face of the second plate, wherein the outer peripheral sealing surfaces of the first and second plates are sealingly joined together. The heat exchanger further comprises a wick material received inside the fluid chamber between the inner face of the first plate and the inner face of the second plate, the sheet of wick material having first and second opposed outer surfaces; and wherein the first outer surface of the wick material is in contact with the inner face of the first plate and the second outer surface of the wick material is in contact with the inner face of the second plate.

The heat exchanger may comprise where the wick material comprises sintered particles. A plurality of liquid flow passages for circulation of the working fluid in a liquid state. The sintered metal particles comprise copper or nickel. each of the liquid flow passages is defined by a hydrophilic area of the wick material in which the sintered metal particles are provided; and wherein each of the liquid flow passages comprises a plurality of pores defined by spaces between the sintered metal particles. The first outer surface of the wick material is metallurgically bonded to the inner face of the first plate and/or the second outer surface of the wick material is metallurgically bonded to the inner face of the second plate. The wick material has a porosity of about 25-75 percent in the plurality of liquid flow passages.

The heat exchanger further comprises a plurality of primary gas flow passages for circulation of the working fluid in a gaseous state; wherein the primary gas flow passages are spaced apart from one another by the plurality of liquid flow passages. Each of the primary gas flow passages is at least partly defined by a void area in the wick material, or at least partly defined by a reduced-height area in the wick material. The heat exchanger further comprises at least one secondary gas flow passage for circulation of the working fluid in a gaseous state, wherein each of the secondary gas flow passages interconnects two or more of the primary gas flow passages. Each of the plurality of primary gas flow passages and/or each of the at least one secondary gas flow passages are at least partly defined by a void area in the wick material, or at least partly defined by a reduced-height area in the wick material. Each of the plurality of primary gas flow passages is defined by a void area in the wick material, and wherein each of the at least one secondary gas flow passages is defined by a reduced-height area in the wick material. Each of the reduced-height areas comprises an area in which the wick material is reduced in thickness relative to the liquid flow passages, so as to permit gas flow above and/or below the reduced-height area. Each of the reduced-height areas comprises the sintered metal particles or a non-porous strip of a metal.

The heat exchanger comprises a vapor chamber and the heat-generating component is a heat-generating component of a personal electronic device selected from the group consisting of a smart phone, a tablet and a computer. An evaporation zone is defined in the interior of the fluid chamber, between the first and second plates, wherein the evaporation zone directly opposes an area of the upper surface which is in contact with the heat-generating component, wherein the heat exchanger further comprises a plurality of spaced-apart primary gas flow passages for circulation of the working fluid in a gaseous state, each of the primary gas flow passages having a first end and a second end, the first ends of the plurality of primary gas flow passages being in open flow communication with one another in the evaporation zone, and the second end of each said primary gas flow passage being distal from the first end, a plurality of spaced-apart liquid flow passages for circulation of the working fluid in a liquid state, and at least one secondary gas flow passage, each of which provides flow communication between the second end of one of the primary gas flow passages and at least one other of said primary gas flow passages; such that the second end of each said primary gas flow passage is in flow communication with at least one other of said primary gas flow passages through said at least one secondary gas flow passage, and such that all the primary gas flow passages in said plurality of primary gas flow passages are interconnected with one another through said at least one secondary gas flow passages, optionally through one or more of said primary gas flow passages. The evaporation zone is located at or proximate to a first end of the heat exchanger, and the second ends of at least some of the primary gas flow passages are located proximate to a second end of the heat exchanger, longitudinally spaced from the evaporation zone, and wherein a transverse gas distribution zone extends transversely across the heat exchanger proximate to the second end thereof, the transverse gas distribution zone being in open flow communication with the second ends of all said primary gas flow passages having their second ends located proximate to the second end of the heat exchanger. The wick material further comprises a conductive patch having a first surface which is metallurgically bonded to the inner face of the first plate, wherein the conductive patch occupies at least a portion of the evaporation zone. The conductive patch has a solid non-porous structure or comprises a sintered structure.

In this way, a heat exchanger for a mobile electronic device may provide a desired amount of heat dissipation and/or absorption, thereby enhancing a user experience and increasing a longevity of the mobile electronic device. The heat exchanger comprises a fluid chamber arranged between inner surfaces of a first plate and a second plate, wherein the fluid chamber comprises at least a wick material comprising sintered and structural copper or nickel. As such, the wick material is not a wire mesh or other similar device. The fluid chamber may further comprise a plurality of fluid passages extending through portions of the wick material along with one or more alternative devices to enhance heat management. In one example, the alternative devices may include a conductive patch or a non-porous strip, wherein each of the devices may be non-porous and non-wicking. The technical effect of arranging a sintered, structural wick material in the fluid chamber is to enhance thermal management while decreasing manufacturing costs and increasing efficiency.

An embodiment of a method for manufacturing a heat exchanger for a device, the heat exchanger further comprising a plurality of liquid flow passages for circulation of the working fluid in a liquid state and a plurality of primary gas flow passages for circulation of the working fluid in a gaseous state, wherein the method comprises providing a mold having a plurality of depressions and a plurality of raised areas, wherein the plurality of depressions defines the plurality of liquid flow passages, and the plurality of raised areas defines the outer periphery of a wick material and the plurality of primary gas flow passages, providing a plurality of metal particles, filling the plurality of depressions with the plurality of metal particles, sintering the plurality of metal particles in the depressions by application of heat and/or pressure to form said a sheet of the wick material, arranging the sheet of wick material between the first plate and the second plate, wherein the first and second plates are positioned with their inner faces facing toward one another, and with the peripheral sealing surface of the first plate in direct contact with the peripheral sealing surface of the second plate, and sealingly joining the peripheral sealing surface of the first plate to the peripheral sealing surface of the second plate.

A system, comprising a mobile electronic device comprising a front cover and a rear cover, a heat exchanger arranged between the front cover and the rear cover, the heat exchanger comprising a fluid chamber arranged between an inner surface of a first plate and an inner surface of a second plate, and a wick material arranged within the fluid chamber, the wick material comprising a sintered material configured to allow a plurality of fluid passages to extend therethrough.

A first example of the system optionally includes where the second plate is completely planar, and wherein the first plate comprises a bend at an outer peripheral sealing surface, wherein the outer peripheral sealing surface is physically coupled to the second plate.

A second example of the system, optionally including the first example, further includes where a heat generating device is in face-sharing contact with an outer surface of the first plate, and wherein an evaporation zone is arranged in the fluid chamber along an axis extending through the heat generating device and the evaporation zone.

A third example of the system, optionally including one or more of the previous examples, further includes where a conductive patch arranged within the fluid chamber, wherein a first surface of the conductive patch is in face-sharing contact with the inner surface of the first plate and a second surface of the conductive patch is in face-sharing contact with the wick material and spaced away from the inner surface of the second plate.

A fourth example of the system, optionally including one or more of the previous examples, further includes where the wick material comprises one or more recessed height areas comprising a sintered material in face-sharing contact with the inner surface of the first plate and spaced away from the inner surface of the second plate.

A fifth example of the system, optionally including one or more of the previous examples, further includes where the wick material comprises a sintered, structural wick material comprising copper or nickel or a non-porous strip of a metal.

What is claimed is:

1. A method for manufacturing a heat exchanger, the method comprising:
   providing a mold having a plurality of depressions and a plurality of raised areas;
   filling the plurality of depressions with a plurality of metal particles;
   sintering the plurality of metal particles in the depressions by application of heat or pressure to form a single sheet of a wick material, the raised areas forming spaces within the sheet of wick material;
   bonding a conductive metal patch to an inner surface of a first plate and then placing the single sheet of the wick material in contact with the inner surface of the first plate and an inner surface a second plate, an interior volume of the sheet of sintered metal particles forming liquid flow passages between the first plate and the second plate, and the single sheet of wick material of the liquid flow passages forming structural support between the first plate and the second plate; and
   sealingly joining a peripheral sealing surface of the first plate to a peripheral sealing surface of the second plate.

2. The method of claim 1, wherein the wick material includes at least one reduced-height area, wherein the at least one reduced-height area is formed by providing a first mold portion with a corresponding reduced-height portion having an upper surface which is spaced above the depressions and below the raised areas of the mold.

3. The method of claim 2, wherein the at least one reduced-height area is formed from one or more of the same particles from which a remainder of the wick material is formed, from particles having a different composition and/or diameter from the particles comprising a remainder of the wick material, and a non-porous strip of metal material which is placed on top of one said reduced-height area.

4. The method of claim 1, further comprising metallurgically bonding the wick material to the inner surface of the first plate and/or the inner surface of the second plate.

5. The method of claim 1, wherein the bonding is metallurgical, and the conductive patch is at least partly located in an evaporation zone.

6. The method of claim 1, further comprising the step of filling a fluid chamber with a working fluid under a partial vacuum; and further comprising a compressing step either during or after the molding operation, wherein the compressing step compresses at least a portion of the wick material and adjusts one or more of a thickness and a porosity of the wick material.

7. A method for manufacturing a heat exchanger for a device, the method comprising:
   providing a mold having a plurality of depressions and a plurality of raised areas;
   filling the plurality of depressions with a plurality of metal particles;
   sintering the plurality of metal particles in the depressions by application of heat and/or pressure to form a single sheet of a wick material, the raised areas forming spaces within the sheet of wick material;
   bonding a conductive metal patch to an inner surface of a first plate and then arranging the single sheet of the wick material in contact with the inner surface of the first plate and an inner surface a second plate, an interior volume of the sheet of sintered metal particles forming liquid flow passages between the first plate and the second plate, and the single sheet of wick material of the liquid flow passages forming compression support between the first plate and the second plate; and sealingly joining a peripheral sealing surface of the first plate to a peripheral sealing surface of the second plate.

8. The method of claim 7, wherein the single sheet of wick material is the only support element between the first plate and the second plate.

9. The method of claim 7, further comprising bonding the wick material to the inner surface of the first plate and the inner surface of the second plate, and the wick material providing tensile support to the first plate and the second plate.

* * * * *